US011723234B2

(12) United States Patent
Chen et al.

(10) Patent No.: US 11,723,234 B2
(45) Date of Patent: Aug. 8, 2023

(54) DISPLAY BACKPLANE, MANUFACTURING METHOD THEREOF, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Peng Chen, Beijing (CN); Kuo Sun, Beijing (CN); Xuan Pang, Beijing (CN); Yanyan Zhao, Beijing (CN); Shanshan Bai, Beijing (CN); Renrong Gai, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 92 days.

(21) Appl. No.: 16/960,883

(22) PCT Filed: Feb. 18, 2020

(86) PCT No.: PCT/CN2020/075713
§ 371 (c)(1),
(2) Date: Jul. 8, 2020

(87) PCT Pub. No.: WO2020/211518
PCT Pub. Date: Oct. 22, 2020

(65) Prior Publication Data
US 2021/0233981 A1    Jul. 29, 2021

(30) Foreign Application Priority Data
Apr. 15, 2019  (CN) .......................... 201910298932.1

(51) Int. Cl.
*H01L 27/32*    (2006.01)
*H01L 51/56*    (2006.01)
(Continued)

(52) U.S. Cl.
CPC ......... *H10K 59/122* (2023.02); *C23C 14/042* (2013.01); *H10K 50/822* (2023.02);
(Continued)

(58) Field of Classification Search
CPC ............... H01L 27/326; H01L 51/5225; H01L 51/5234; C23C 14/042
See application file for complete search history.

(56) References Cited

U.S. PATENT DOCUMENTS 10,084,150 B1    9/2018  Lou
10,937,993 B2 *  3/2021  Tang ..................... H01L 27/326
(Continued)

FOREIGN PATENT DOCUMENTS

CN    102456713 A    5/2012
CN    103219355 A    7/2013
(Continued)

OTHER PUBLICATIONS

Machine translation, Du, Chinese Pat. Pub. No. CN-109786582-A, Clarivate Analytics, Jul. 30, 2022, all pages. (Year: 2022).*
(Continued)

*Primary Examiner* — Victoria K. Hall
(74) *Attorney, Agent, or Firm* — Ling Wu; Stephen Yang; Ling and Yang Intellectual Property

(57) ABSTRACT

The present disclosure provides a display backplane, a manufacturing method thereof and a display device. The display backplane includes: a substrate defining a transparent display area and a normal display area; a first insulating layer disposed on a side of the substrate and having a plurality of openings; an emitting layer disposed in the openings; and a first electrode disposed on a remote side of the emitting layer from the substrate and including a first sub-layer and a second sub-layer which are stacked, wherein an orthographic projection of the emitting layer on the
(Continued)

substrate is within an orthographic projection of the second sub-layer on the substrate, and the sub-layer is patterned in the transparent display area.

1 Claim, 4 Drawing Sheets

(51) Int. Cl.

| | | |
|---|---|---|
| *H10K 59/122* | (2023.01) | |
| *C23C 14/04* | (2006.01) | |
| *H10K 50/822* | (2023.01) | |
| *H10K 50/828* | (2023.01) | |
| *H10K 71/00* | (2023.01) | |
| *H10K 59/121* | (2023.01) | |
| *H10K 102/00* | (2023.01) | |

(52) U.S. Cl.
CPC ........... *H10K 50/828* (2023.02); *H10K 71/00* (2023.02); *H10K 59/121* (2023.02); *H10K 2102/351* (2023.02)

(56) References Cited

U.S. PATENT DOCUMENTS

| | | | | |
|---|---|---|---|---|
| 11,239,446 | B2* | 2/2022 | Chung | H01L 27/326 |
| 2006/0290277 | A1* | 12/2006 | Takahashi | H01L 51/5206 |
| | | | | 313/517 |
| 2009/0051278 | A1* | 2/2009 | San | H01L 51/5268 |
| | | | | 313/504 |
| 2009/0052195 | A1* | 2/2009 | San | G02B 5/0278 |
| | | | | 362/355 |
| 2009/0243477 | A1* | 10/2009 | San | B82Y 20/00 |
| | | | | 428/323 |
| 2011/0220899 | A1* | 9/2011 | Park | H01L 51/5231 |
| | | | | 257/59 |
| 2012/0104422 | A1 | 5/2012 | Lee et al. | |
| 2013/0255780 | A1* | 10/2013 | Iwanaga | H01L 51/0036 |
| | | | | 136/263 |
| 2014/0199808 | A1* | 7/2014 | Sugimoto | C23C 14/042 |
| | | | | 438/99 |
| 2014/0242737 | A1* | 8/2014 | Chung | B05C 21/005 |
| | | | | 438/35 |
| 2014/0284563 | A1* | 9/2014 | Baek | H01L 51/5225 |
| | | | | 257/40 |
| 2015/0194638 | A1 | 7/2015 | Choi et al. | |
| 2015/0318334 | A1* | 11/2015 | Kim | H01L 51/56 |
| | | | | 257/40 |
| 2015/0333288 | A1* | 11/2015 | Sugi | H01L 27/3251 |
| | | | | 315/313 |
| 2015/0340642 | A1* | 11/2015 | Shinjo | H01L 27/3204 |
| | | | | 257/40 |
| 2015/0357382 | A1 | 12/2015 | Chung et al. | |
| 2015/0364715 | A1* | 12/2015 | Yoon | H01L 51/5225 |
| | | | | 257/40 |
| 2016/0218314 | A1* | 7/2016 | Kim | H01L 51/5234 |
| 2016/0240811 | A1* | 8/2016 | Kim | H01L 27/3246 |
| 2016/0260923 | A1 | 9/2016 | Wu | |
| 2016/0372697 | A1* | 12/2016 | Kakizoe | H01L 51/56 |
| 2017/0084572 | A1 | 3/2017 | Liu et al. | |
| 2017/0213996 | A1 | 7/2017 | Furukawa et al. | |
| 2018/0151824 | A1* | 5/2018 | Park | H01L 51/5004 |
| 2018/0209028 | A1* | 7/2018 | Li | C23C 14/24 |
| 2019/0245026 | A1* | 8/2019 | Woo | H01L 27/3246 |
| 2020/0075864 | A1* | 3/2020 | Helander | H10K 71/621 |
| 2020/0124927 | A1* | 4/2020 | Kim | H10K 59/352 |
| 2020/0135837 | A1* | 4/2020 | Cui | H01L 51/5237 |
| 2020/0212368 | A1* | 7/2020 | Tang | H10K 50/86 |
| 2020/0220100 | A1* | 7/2020 | Zhang | H01L 51/5225 |
| 2021/0020704 | A1* | 1/2021 | Kim | H04L 63/20 |
| 2021/0249624 | A1* | 8/2021 | Lou | H10K 59/173 |
| 2021/0327976 | A1* | 10/2021 | Yang | H01L 27/3267 |
| 2021/0336184 | A1* | 10/2021 | Xiang | H01L 51/5225 |
| 2021/0336193 | A1* | 10/2021 | Tan | H01L 51/0011 |
| 2021/0363628 | A1* | 11/2021 | Bai | C23C 14/042 |
| 2021/0365136 | A1* | 11/2021 | Wang | G06F 3/044 |
| 2021/0376008 | A1* | 12/2021 | Tan | H01L 51/56 |
| 2022/0102670 | A1* | 3/2022 | Peng | H10K 59/121 |
| 2022/0115470 | A1* | 4/2022 | Kim | H01L 51/5246 |
| 2022/0155831 | A1* | 5/2022 | Sun | C23C 14/044 |

FOREIGN PATENT DOCUMENTS

| | | | | |
|---|---|---|---|---|
| CN | 203118951 U | | 8/2013 | |
| CN | 103779377 A | | 5/2014 | |
| CN | 104134681 A | | 11/2014 | |
| CN | 104795434 A | | 7/2015 | |
| CN | 106538060 A | | 3/2017 | |
| CN | 106981585 A | | 7/2017 | |
| CN | 107768545 A | | 3/2018 | |
| CN | 109461758 A | | 3/2019 | |
| CN | 109786582 A | * | 5/2019 | ............ H01L 51/52 |
| CN | 109962096 A | | 7/2019 | |

OTHER PUBLICATIONS

Office Action dated Aug. 28, 2020 for Chinese Patent Application No. 201910298932.1 and English Translation.
International Search Report for PCT/CN2020/075713 dated May 8, 2020.

* cited by examiner

DISPLAY BACKPLANE, MANUFACTURING METHOD THEREOF, AND DISPLAY DEVICE

CROSS-REFERENCE TO RELATED APPLICATIONS

The present application is a U.S. National Phase Entry of International Application No. PCT/CN2020/075713 having an international filing date of Feb. 18, 2020, which claims the priority and benefits of the patent application for an invention with the patent application number 201910298932.1 filed to the China National Intellectual Property Administration on Apr. 15, 2019 and titled "Display Backplane, Manufacturing Method thereof, and Display Device". The above-identified applications are hereby incorporated by reference.

TECHNICAL FIELD

The present disclosure relates to the field of manufacture for display technology, in particular to a display backplane, a manufacturing method thereof, and a display device.

BACKGROUND

With the development of display technology, a transparent display screen has attracted much attention as a new technology disclosure in recent years, which has expanded the scenarios and ranges of the display disclosure. A transparent display screen, which is transparent to a certain extent or within a certain area, enables viewers to clearly see a scene behind the display screen.

Therefore, a transparent display screen is suitable for a variety of disclosures such as building windows, car windows, and shop windows. Apart from its transparent display function, it also has the potential to be used as an information display in the future, thus attracting much attention from the market. Local transparent display means that a display area is divided into a normal display area and a transparent display area, but components such as cameras can be arranged in the transparent display area, and this greatly increases the screen proportion to realize a full screen.

SUMMARY

In a first aspect of the present disclosure, the present disclosure provides a display backplane.

According to an implementation of the present disclosure, the display backplane includes: a substrate defining a transparent display area and a normal display area; a first insulating layer disposed on a side of the substrate and having multiple openings; an emitting layer disposed in the openings; and a first electrode disposed on a remote side of the emitting layer from the substrate and including a first sub-layer and a second sub-layer which are stacked, wherein an orthographic projection of the emitting layer on the substrate is within an orthographic projection of the second sub-layer on the substrate, and the second sub-layer is patterned in the transparent display area.

In addition, the display backplane according to the above implementation of the present disclosure may also have the following additional technical features.

According to an implementation of the present disclosure, there is a separating dike among the openings of the first insulating layer. In the transparent display area, an orthographic projection of the separating dike on the substrate partially overlaps with the orthographic projection of the second sub-layer on the substrate.

According to an implementation of the present disclosure, in the transparent display area and the normal display area, the first sub-layer is of a whole layer structure; and in the normal display area, the second sub-layer is of a whole layer structure.

According to an implementation of the present disclosure, the first sub-layer is located between the second sub-layer and the emitting layer.

According to an implementation of the present disclosure, thickness of the first sub-layer is smaller than the thickness of the second sub-layer.

According to an implementation of the present disclosure, the first sub-layer is in direct contact with the second sub-layer.

According to an implementation of the present disclosure, in the transparent display area, an orthographic projection of the second electrode on the substrate is within the orthographic projection of the second sub-layer on the substrate.

According to an implementation of the present disclosure, the transparent display area is disposed on a side of the normal display area.

According to an implementation of the present disclosure, the transparent display area is disposed between two normal display areas.

In a second aspect of the present disclosure, the present disclosure provides a method of manufacturing a display backplane.

According to an implementation of the present disclosure, the method includes the following acts of: forming a first insulating layer and an emitting layer on a side of a substrate, wherein a transparent display area and a normal display area are divided on the substrate, and the first insulating layer has multiple openings, and an orthographic projection of the openings on the substrate is within an orthographic projection of the emitting layer on the substrate; forming a first sub-layer of a first electrode on a remote side of the emitting layer and a remote side of the first insulating layer from the substrate; forming a second sub-layer of the first electrode on a remote surface of the first sub-layer from the substrate, and patterning the second sub-layer in the transparent display area, wherein the orthographic projection of the emitting layer on the substrate is within an orthographic projection of the second sub-layer on the substrate.

In addition, the manufacturing method according to the above implementation of the present disclosure may also have the following additional technical features.

According to an implementation of the present disclosure, the method further includes forming a second electrode on a side of the substrate, wherein the second electrode is formed between the substrate and the first insulating layer and is in contact with the emitting layer in the openings.

According to an implementation of the present disclosure, the first sub-layer is formed by a vapor deposition using a first mask having a first opening portion, and a shape of the first opening portion corresponds to a shape of the first sub-layer.

According to an implementation of the present disclosure, the second sub-layer is formed by a vapor deposition using a second mask defining a second opening portion and a fine metal mask portion, and an opening shape of the second opening portion corresponds to a shape of the second sub-layer in the normal display area, and a hollowed-out pattern of the fine metal mask portion corresponds to a shape of the second sub-layer in the transparent display area.

In a third aspect of the present disclosure, the present disclosure provides a display device.

According to an implementation of the present disclosure, the display device includes the display backplane described above.

REFERENCE SIGNS

100 Substrate
200 Second Insulating Layer
201 Second Via
300 Second Electrode
400 First Insulating Layer
401 Opening
402 Separating Dike
500 Emitting Layer
610 First Sub-Layer
620 Second Sub-Layer
710 Active Layer
720 Gate Insulating Layer
730 Gate
740 Interlayer Insulating Layer
751 Source
752 Drain
760 First Via
A Normal Display Area
B Transparent Display Area
C First Mask
C1 First Opening Portion
D Second Mask
D1 Second Opening Portion
D2 Fine Metal Part
E Pattern

DETAILED DESCRIPTION

The present disclosure is accomplished based on the following discoveries of the inventors.

The inventors of the present disclosure have found that the bottleneck of local transparent display of an organic light emitting diode (OLED) at present is that the low transmittance of the cathode formed by whole-surface evaporation affects the transparent display effect. At present, the thickness of commonly used cathode materials must be less than 20 nm to have good light transmission characteristics. However, when a cathode layer is very thin, it will be accompanied by technical problems of circuit break or easy oxidation of metal. These defects will further form shortcomings and lead to increased loss in charge injection process. The thinner the thickness of the metal cathode layer, the higher its square resistance, and this results in the technical problem of uneven brightness of an active-matrix organic light-emitting diode (AMOLED) display screen.

Through in-depth research, the inventors of the present disclosure have found that: a first sub-layer and a second sub-layer which are stacked can be respectively formed by two vapor depositions, and the second sub-layer in a transparent display area is patterned. In this way, not only transparent display effect of the transparent display area is ensured, but also cathode transmittance at openings of a normal display area and the transparent display area is consistent. Thereby, optical uniformity of a local transparent display screen is ensured, and the problem of color shift of a display device is solved.

In view of this, an object of the present disclosure is to provide a display backplane for realizing local transparent display with better transparent display effect and better optical uniformity.

In one aspect of the present disclosure, the present disclosure provides a display backplane.

Figure 1:
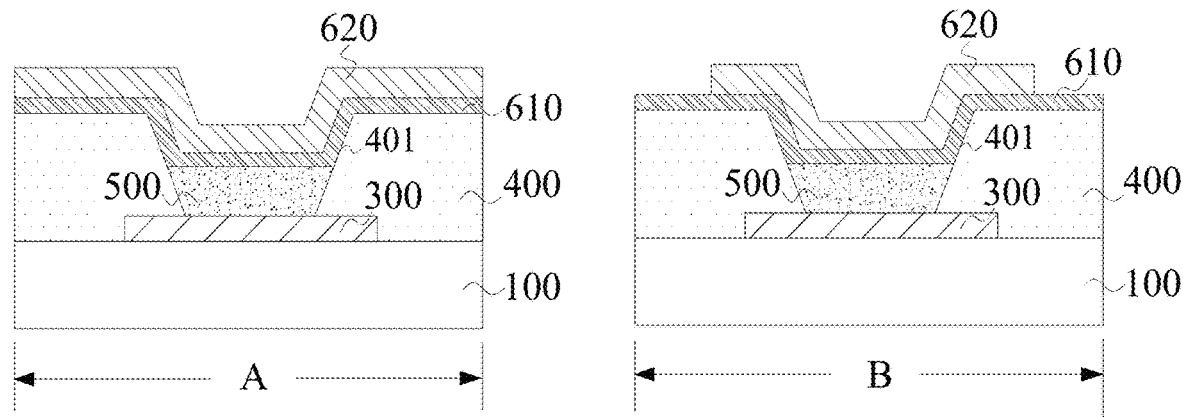
FIG. 1 is a schematic cross-sectional diagram of structures of a normal display area and a transparent display area of a display backplane according to an implementation of the present disclosure.

According to an implementation of the present disclosure, referring to FIG. 1, the display backplane includes a substrate 100, a first insulating layer 400, an emitting layer 500, and a first electrode. Herein, referring to FIG. 2, the substrate 100 defines a transparent display area B and a normal display area A. The first insulating layer 400 covers the substrate 100, and the first insulating layer 400 has multiple openings 401, an orthographic projection of the openings 401 on the substrate 100 is within an orthographic projection of the second electrode 300 on the substrate 100. The emitting layer 500 is disposed in the openings 401 and is in contact with the second electrode 300. The first electrode is disposed on a remote side of the emitting layer 500 from the substrate 100, and the first electrode includes a first sub-layer 610 and a second sub-layer 620 which are stacked. Herein, in the transparent display area B, the second sub-layer 620 is patterned, and an orthographic projection of the emitting layer 500 on the substrate 100 is within the orthographic projection of the patterned second sub-layer 620 on the substrate 100. It should be noted that "patterned" in the present disclosure specifically refers to a non-whole layer structure, that is, a structure obtained by carving out a specific shape after a whole layer of material is firstly formed during the manufacture. Specifically, the second sub-layer 620 in the transparent display area B may include multiple sub-patterns spaced apart from each other, and each sub-pattern corresponds to one sub-pixel.

In some implementations of the present disclosure, referring to FIG. 1, the display backplane may further include a second electrode 300. Herein, referring to FIG. 3, the second electrode 300 is disposed between the second insulating layer 200 and the substrate 100, and the second electrode 300 is in contact with the emitting layer 500 in the openings 401. In this way, an OLED device with a better function and structure can be obtained. In some specific examples, the second electrode 300 may be an untransparent anode, and the first electrode 400 may be a transparent cathode, so that the display backplane may have a top-emitting display mode.

Figure 3:
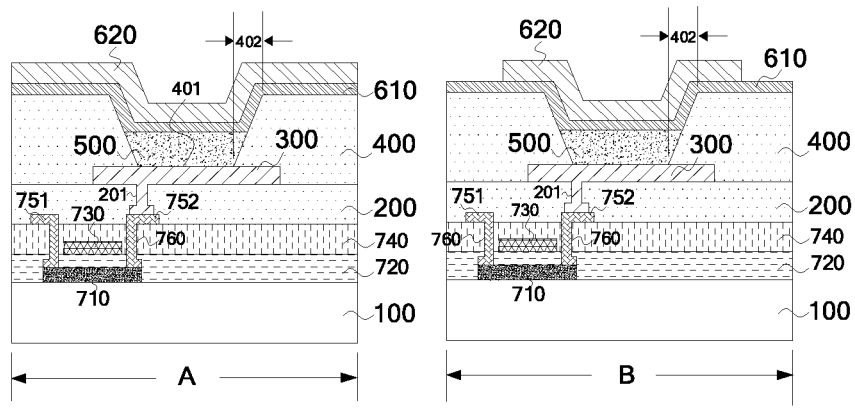
FIG. 3 is a schematic cross-sectional diagram of structures of a normal display area and a transparent display area of a display backplane according to another implementation of the present disclosure.

In some implementations of the present disclosure, referring to FIG. 3, there is a separating dike 402 among the openings 401 of the first insulating layer 400. In the transparent display area B, an orthographic projection of the separating dike 402 on the substrate 100 partially overlaps with the orthographic projection of the second sub-layer 620 on the substrate 100. In this way, transmittance at openings of the normal display area and the transparent display area can be further ensured to be more consistent. Thereby, optical uniformity of a local transparent display screen is further ensured, and the problem of color shift of a display device is solved.

In some implementations of the present disclosure, the first sub-layer 610 may cover the emitting layer 500 and the first insulating layer 400, and the second sub-layer 620 may cover a surface of the first sub-layer 610 remote from the substrate 100, so that both the second sub-layer 620 and the whole layer of the first sub-layer 610 may be evener. In other implementations of the present disclosure, positions of the first sub-layer 610 and the second sub-layer 620 can be interchanged, that is, the second sub-layer 620 can cover the emitting layer 500 and the first insulating layer 400, and the first sub-layer 610 can cover a remote surface of the second sub-layer 620 from the substrate 100. In this way, optical uniformity of a local transparent display screen can also be realized, thereby the problem of color shift of a display device is solved.

In some implementations of the present disclosure, referring to FIG. 1, the second sub-layer 620 is patterned only in the transparent display area B. In other words, the second sub-layer 620 is of a whole layer structure in the normal display area A, and the first sub-layer 610 is of a whole layer structure in both the transparent display area B and the normal display area A. In this way, in a manufacturing process of the first electrode composed of the first sub-layer 610 and the second sub-layer 620, only two sub-layers need to be deposited, and the second sub-layer 620 in the transparent display area B is then patterned.

In some implementations of the present disclosure, the thickness of the first sub-layer 610 may be less than 10 nm, and the thickness of the second sub-layer 620 may be greater than 10 nm, so that the whole first sub-layer 610 is thin and has good light transmission characteristics which enable better transparent display effect in the transparent display area B except the opening area. Moreover, the first electrode composed of the whole layer of first sub-layer 610 and the patterned second sub-layer 620 in the transparent display area B can make thickness of the first electrode in the area of the emitting layer 500 in the transparent display area B consistent with thickness of the first electrode in the normal display area A, and thus optical uniformity of the whole local transparent display screen is ensured, and the problem of color shift is solved. In some specific examples, the first electrode composed of the first sub-layer 610 and the second sub-layer 620 may have a total thickness of 12 to 15 nm, which approximates the thickness of the uniform and integrated whole layer of first electrode of an existing design, but the transparent display area B can have better transparent display effect and optical uniformity of the whole local transparent display screen is better.

In some implementations of the present disclosure, the first sub-layer 610 can be in direct contact with the second sub-layer 620, i.e. the first sub-layer 610 and the second sub-layer 620 are designed as parallel resistors on a circuit. In this way, the first electrode composed of the first sub-layer and the second sub-layer which are in the parallel connection can significantly reduce the square resistance of the first electrode, and thereby further reduce the risk of disconnection and solve the problem of uneven brightness.

In some implementations of the present disclosure, in the transparent display area B, the orthographic projection of the first sub-layer 610 on the substrate 100 is within the orthographic projection of the second sub-layer 620 on the substrate 100. In this way, the second sub-layer 620 as a part of a cathode can completely cover the second electrode as an anode, and this enables the bottom of the OLED structure to emit light with better effect.

Figure 2:
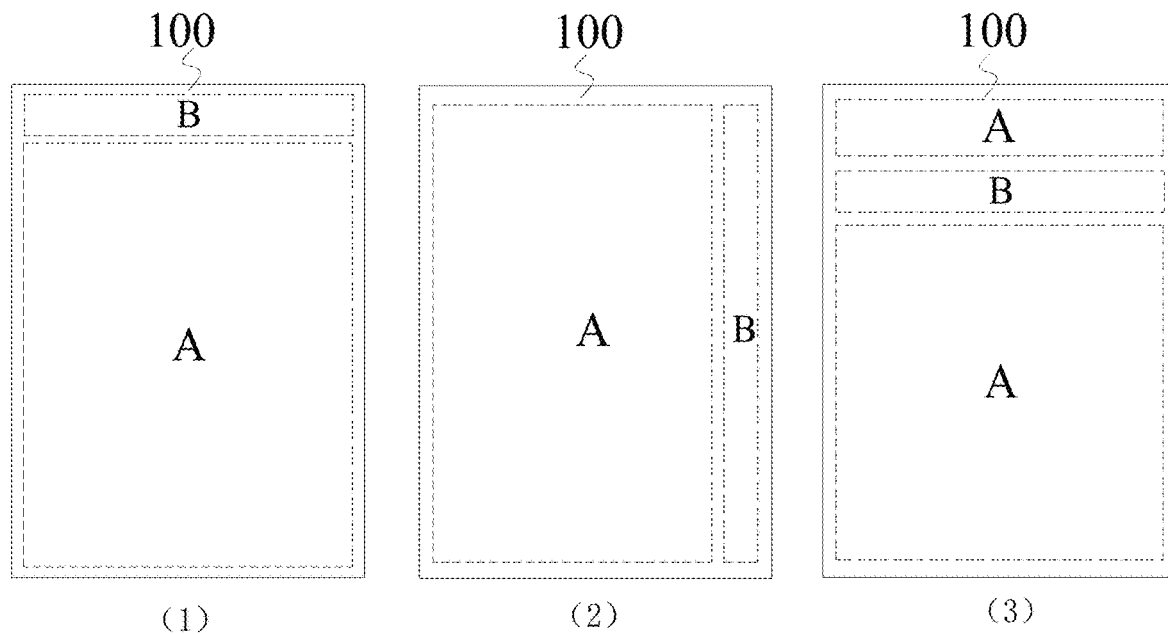
FIG. 2 is a schematic diagram of three types of distribution of a normal display area and a transparent display area according to an implementation of the present disclosure.

According to the implementation of the present disclosure, the specific distribution modes of the normal display area A and the transparent display area B on the substrate 100 are not particularly limited, and those skilled in the art can design accordingly according to the specific types of the display backplane. In some implementations of the present disclosure, referring to (1) and (2) of FIG. 2, the transparent display area B may be disposed on a side of the normal display area A. For example, the transparent display area B in (1) of FIG. 2 is disposed on a short side of the normal display area A, so that components such as a camera can be mounted in the transparent display area B according to the design of a mobile phone screen. Optionally, the transparent display area B in (2) of FIG. 2 is disposed on a long side of the normal display area A, so that components such as a camera can be mounted in the transparent display area B according to the design of a tablet computer screen. In other implementations of the present disclosure, referring to (3) of FIG. 2, the transparent display area B can be disposed between two normal display areas A, so that the design requirement of transparency in the middle of billboards, windows and the like can be met.

In some specific examples of the present disclosure, referring to FIG. 3, the display backplane may further include a thin film transistor (TFT) disposed between the substrate 100 and the second insulating layer 200, and the thin film transistor includes an active layer 710, a gate insulating layer 720, a gate 730, an interlayer insulating layer 740, a source 751, and a drain 752 that are stacked. Herein, the source 751 and drain 752 are electrically connected to the active layer 710 by a first via 760, which passes through the gate insulating layer 720 and the interlayer insulating layer 740, and the second electrode 300 is electrically connected to the drain 752 by a second via 201 through the second insulating layer 200. In this way, an OLED device with a better function and structure can be obtained.

According to an implementation of the present disclosure, the material for forming the first electrode includes at least one of aluminum (Al), silver (Ag), magnesium-silver alloy (Mg—Ag), and calcium (Ca). In this way, thickness of the conductive metal material of the above type of materials is less than 10 nm, and better light transmission characteristics can be obtained. According to an implementation of the present disclosure, the specific material for forming the emitting layer 500 is not particularly limited, and any light emitting material commonly in the art can be used, and those skilled in the art can make corresponding selection according to the specific requirements of the local transparent display effect. According to an implementation of the present disclosure, the material for forming the second electrode 300 is not particularly limited, and any transparent anode material commonly used in the art can be used, and those skilled in the art can make corresponding selection according to the specific material of the emitting layer 500. According to an implementation of the present disclosure, the material for forming each insulating layer (including the second insulating layer 200, the first insulating layer 400, the gate insulating layer 720, the interlayer insulating layer 740, etc.) is not particularly limited, as long as it is the insulating light-transmitting material, and those skilled in the art can make corresponding selection according to the requirements of the actual insulating effect.

To sum up, according to an implementation of the present disclosure, the present disclosure provides a display backplane including a first sub-layer and a second sub-layer which can be stacked, formed by two vapor depositions, and constitute a first electrode in an OLED structure, and the second sub-layer in a transparent display area is patterned. In this way, transparent display effect of a transparent display area is ensured, and transmittance of first electrodes at openings of a normal display area and the transparent display area is consistent. Thereby, optical uniformity of a local transparent display screen is ensured, and the problem of color shift of a display device is solved.

Figure 4:
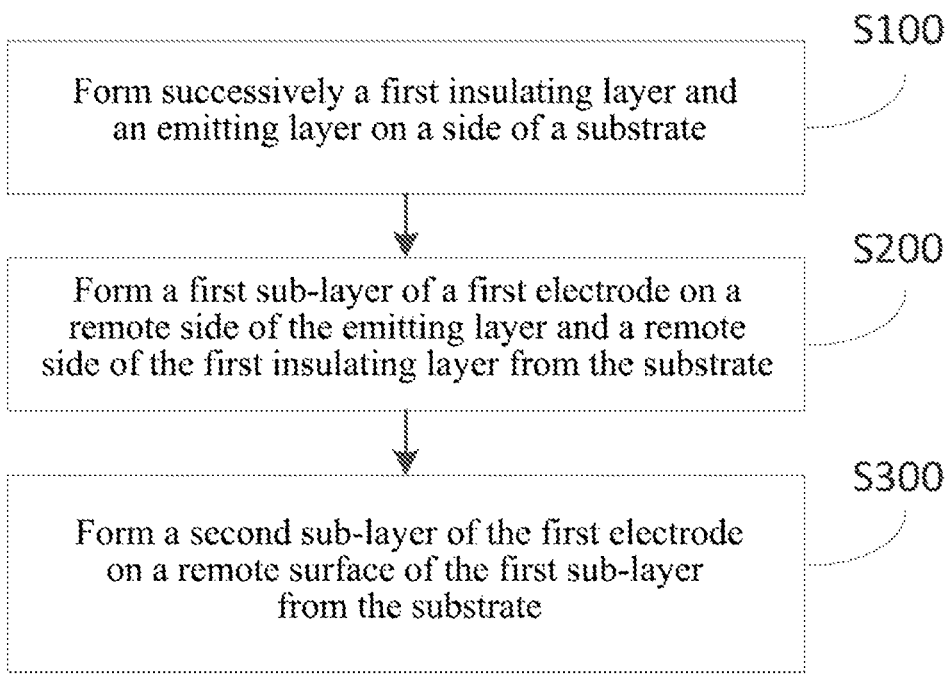
FIG. 4 is a flowchart of a method for manufacturing a display backplane according to an implementation of the present disclosure.

In another aspect of the present disclosure, the present disclosure provides a method of manufacturing a display backplane. According to an implementation of the present disclosure, referring to FIG. 4, the manufacturing method includes: acts S100, S200, and S300.

S100: a first insulating layer and an emitting layer are formed on a side of a substrate. In this act, the first insulating layer and the emitting layer are formed on a side of the substrate, a transparent display area and a normal display area are divided on the substrate, the first insulating layer has multiple openings, and an orthographic projection of the openings on the substrate is within an orthographic projection of the emitting layer on the substrate.

Specifically, a whole layer of the second insulating layer can be deposited on a side of the substrate first, then a patterned second electrode is formed on a remote surface of the second insulating layer from the substrate by a vapor deposition, a whole layer of a first insulating layer is continuously deposited on remote surfaces of the second electrode and the second insulating layer from the substrate, openings are photoetched in an area of the second electrode, then an emitting layer is formed in the openings, and the emitting layer is in contact with the second electrode in the openings.

S200: a first sub-layer of a first electrode is formed on a remote side of the emitting layer and a remote side of the first insulating layer from the substrate.

In this act, the first sub-layer of the first electrode is continuously formed on a side of the emitting layer formed at act S100 and a side of the first insulating layer formed at act S100 which are remote from the substrate, and the first sub-layer is of a structure having a whole surface. In some implementations of the present disclosure, thickness of the first sub-layer formed by a vapor deposition may be less than 10 nm, so that the thin whole first sub-layer may have good light transmission characteristics.

Figure 5:
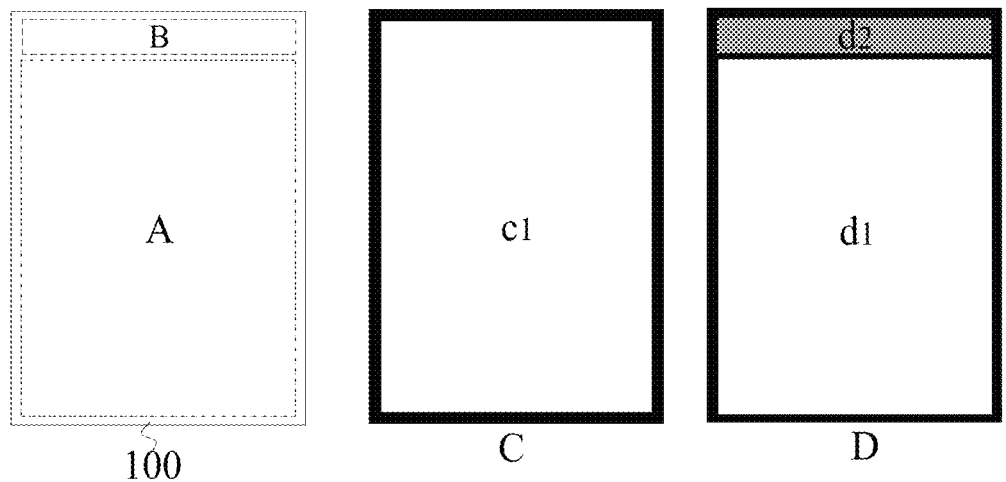
FIG. 5 is a schematic diagram of a first mask and a second mask corresponding to subareas of a display backplane according to an implementation of the present disclosure.
Figure 6:
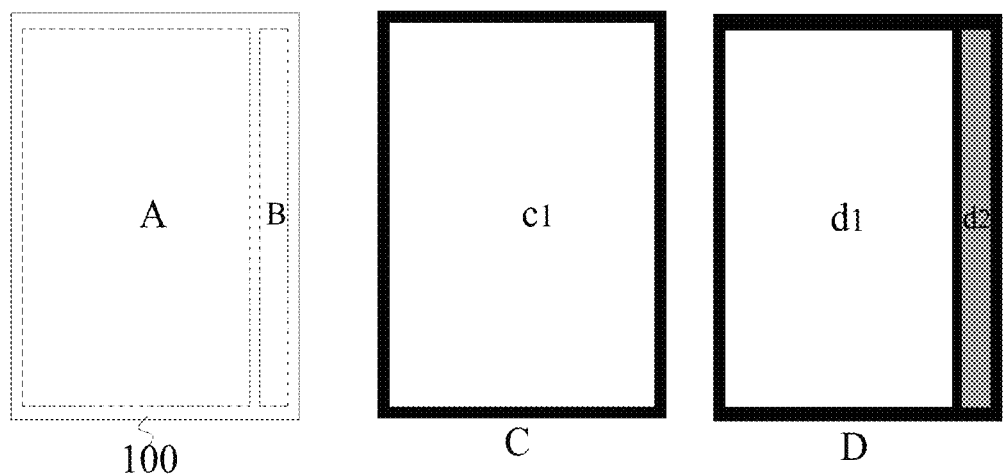
FIG. 6 is a schematic diagram of a first mask and a second mask corresponding to subareas of a display backplane according to another implementation of the present disclosure.
Figure 7:
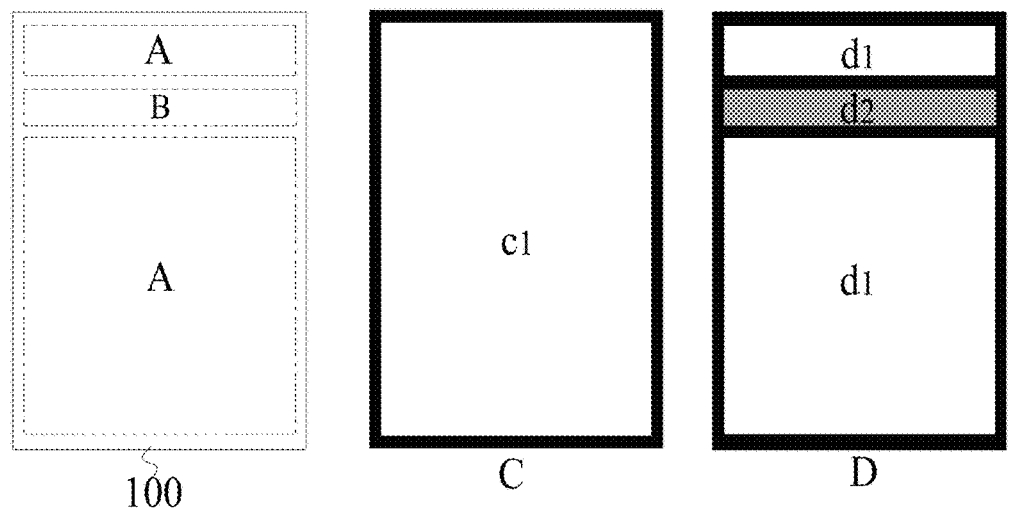
FIG. 7 is a schematic diagram of a first mask and a second mask corresponding to partitions of a display backplane according to another implementation of the present disclosure.

In some implementations of the present disclosure, referring to FIGS. 5 to 7, the first sub-layer is formed by a vapor deposition using a first mask C, which has a first opening portion c1, and a shape of the first opening portion c1 corresponds to a shape of the first sub-layer. In this way, using the first mask C described above, a thin first sub-layer can be formed directly by a vapor deposition.

S300: a second sub-layer of the first electrode is formed on a remote surface of the first sub-layer from the substrate.

In this act, the second sub-layer of the first electrode is formed on the remote surface of the first sub-layer from the substrate, and the second sub-layer in the transparent display area is patterned, wherein the orthographic projection of the emitting layer on the substrate is within an orthographic projection of the second sub-layer on the substrate. In some implementations of the present disclosure, thickness of the formed second sub-layer may be greater than 10 nm. In this way, thickness of the first electrode, composed of the first sub-layer and the second sub-layer, in the opening area of the transparent display area is consistent with that in the normal display area. Thereby, optical uniformity of the whole local transparent display screen is ensured, and the problem of a color shift is solved.

In some implementations of the present disclosure, referring to FIGS. 5 to 7, the second sub-layer is formed by a vapor deposition using a second mask D defining a second opening portion d1 and a fine metal mask portion d2, and an opening shape of the second opening portion d1 corresponds to a shape of the second sub-layer in the normal display area, and a hollowed-out pattern of the fine metal mask portion d2 corresponds to a shape of the second sub-layer in the transparent display area. In this way, using the first mask D described above, the second sub-layer, which is a whole layer in the normal display area while patterned in the transparent display area, can be formed directly by a vapor deposition.

Figure 8:
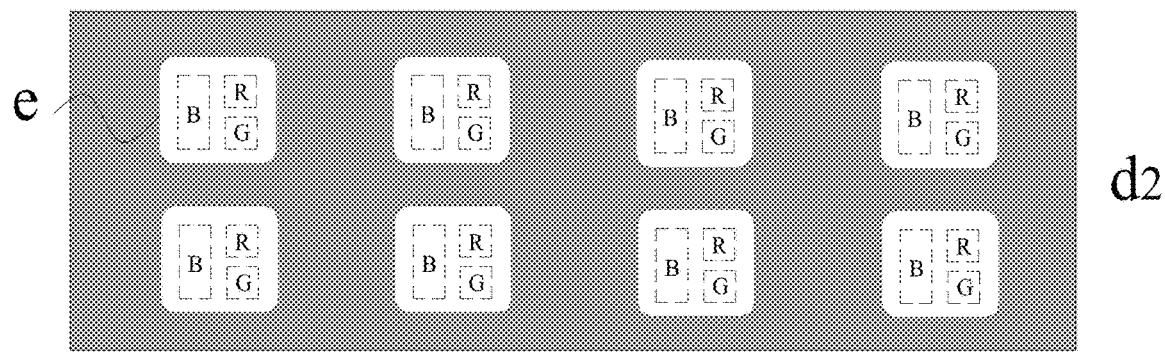
FIG. 8 is a schematic diagram of distribution of a hollowed-out pattern of a fine metal mask portion of a second mask according to an implementation of the present disclosure.

In some implementations of the present disclosure, referring to FIG. 8, a hollowed-out pattern e in the fine metal mask portion d2 of the second mask D may refer to array arrangement of a pixel unit, for example, each pixel unit includes a red sub-pixel (R), a green sub-pixel (G) and a blue sub-pixel (B). In this way, an area of a pixel unit is within the hollowed-out pattern e, thereby a second sub-layer covering every one of RGB sub-pixels is formed.

Figure 9:
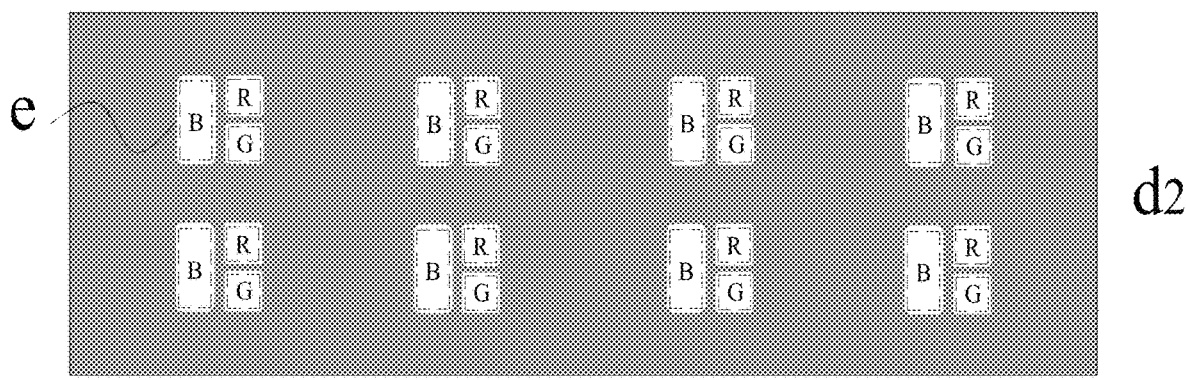
FIG. 9 is a schematic diagram of distribution of a hollowed-out pattern of a fine metal mask portion of a second mask according to an implementation of the present disclosure.

In other implementations of the present disclosure, referring to FIG. 9, a hollowed-out pattern in the fine metal mask portion d2 of the second mask D may refer to array arrangement of sub-pixels, for example, each pixel unit includes a red sub-pixel (R), a green sub-pixel (G) and a blue sub-pixel (B). In this way, each hollow-out pattern e individually corresponds to a different RGB sub-pixel, so that the transparent effect area in the transparent display area is larger, and the local transparent display effect is further improved.

To sum up, according to an implementation of the present disclosure, the present disclosure provides a manufacturing method, which uses two acts to form respectively a first sub-layer and a second sub-layer, which are in different shapes and constitute a first electrode in an OLED structure. In this way, a display backplane with better transparent display effect and better optical uniformity in a transparent display area can be manufactured, and the manufacturing method is simple to operate and easy to realize.

In another aspect of the present disclosure, the present disclosure provides a display device. According to an implementation of the present disclosure, the display device includes the display backplane described above.

According to an implementation of the present disclosure, the specific type of the display device is not particularly limited. For example, the display device may be a display screen, a television, a mobile phone, a tablet computer, or a smart watch. Those skilled in the art can make corresponding selections according to the actual requirements of the display device, which will not be repeated here. It should be noted that the display device includes other necessary components and structures in addition to the display panel. For example, in an OLED display screen, a component such as a housing, a control circuit board or a power cord may be included. Those skilled in the art can make a corresponding supplement according to functions of the display device, and the details will not be repeated here.

To sum up, according to an implementation of the present disclosure, the present disclosure provides a display device, of which a display backplane has better transparent display effect and better optical uniformity. Thereby, the display device is enabled to have better local transparent display effect and better optical uniformity, and further the display device is enabled to have higher market competitiveness. Those skilled in the art can understand that the features and advantages described above for the display backplane are still applicable to the display device and will not be repeated here.

In the description of the present disclosure, it should be understood that the azimuth or position relationship indicated by the terms "center", "longitudinal", "transverse", "length", "width", "thickness", "on", "below", "front", "rear", "left", "right", "vertical", "horizontal", "top", "bottom", "inner", "outer", "clockwise", "counterclockwise", "axial", "radial", "circumferential" and the like is based on the azimuth or position relationship shown in the drawings. It is only for the convenience of describing the present disclosure and simplifying the description, but is not intended to indicate or imply that the device or element referred to must have the specific orientation, be constructed and operated in the specific orientation, and thus it cannot be interpreted as a limitation on the present disclosure.

In addition, the terms "first" and "second" are used for description purposes only, and cannot be interpreted as indicating or implying relative importance or implicitly indicating the number of technical features referred to. Thus, the features defined with "first" and "second" may include at least one of the features explicitly or implicitly. In the description of the present disclosure, "a plurality of" means at least two, for example, two or three, unless specified otherwise.

Reference throughout this specification to "an implementation," "some implementations," "an example," "a specific example," or "some examples," means that a particular feature, structure, material, or characteristic described in connection with the implementation or example is included in at least one implementation or example of the present disclosure. In this specification, the schematic illustration of the above-mentioned terms is not necessarily directed to the same implementation or example. Moreover, the specific features, structures, materials, or characteristics described may be combined in any one or more implementations or examples in a proper way. In addition, those skilled in the art may incorporate and combine different implementations or examples and features of different implementations or examples described in this specification if there is no conflict.

Although implementations of the present disclosure have been shown and described above, it should be understood that above implementations are just illustrative, and should not be construed as limiting the present disclosure. For those skilled in the art, changes, modifications, substitutions and variations can be made to the implementations without departing from spirit, principles and scope of the present disclosure.

What we claim is:

1. A method for manufacturing a display backplane, comprising:

forming a first insulating layer and an emitting layer on a side of a substrate, wherein a transparent display area and a normal display area are divided on the substrate, the first insulating layer has a plurality of openings, and an orthographic projection of the openings on the substrate is within an orthographic projection of the emitting layer on the substrate;

forming a first sub-layer of a first electrode on a remote side of the emitting layer and a remote side of the first insulating layer from the substrate; and forming a second sub-layer of the first electrode on a remote surface of the first sub-layer from the substrate, wherein the second sub-layer is patterned by a vapor deposition using a second mask defining a second opening portion and a fine metal mask portion, and an opening shape of the second opening portion corresponds to a shape of the second sub-layer in the normal display area, and a hollowed-out pattern of the fine metal mask portion corresponds to a shape of the second sub-layer in the transparent display area, wherein a thickness of the first sub-layer is smaller than a thickness of the second sub-layer.

* * * * *